(12) United States Patent
Jensen et al.

(10) Patent No.: US 10,396,791 B2
(45) Date of Patent: Aug. 27, 2019

(54) OUTPUT DRIVER COMPRISING MOS SWITCHES WITH ADJUSTABLE BACK BIASING

(71) Applicant: GN Hearing A/S, Ballerup (DK)

(72) Inventors: Dan Raun Jensen, Hellerup (DK); Per Asbeck, Copenhagen S (DK)

(73) Assignee: GN Hearing A/S, Ballerup (DK)

( * ) Notice: Subject to any disclaimer, the term of this patent is extended or adjusted under 35 U.S.C. 154(b) by 0 days.

(21) Appl. No.: 15/673,306

(22) Filed: Aug. 9, 2017

(65) Prior Publication Data
US 2018/0191346 A1    Jul. 5, 2018

(30) Foreign Application Priority Data

Dec. 29, 2016 (EP) .................................. 16207327

(51) Int. Cl.
| | |
|---|---|
| H03F 3/181 | (2006.01) |
| H03K 19/003 | (2006.01) |
| H03F 3/217 | (2006.01) |
| H03K 5/134 | (2014.01) |
| H01L 27/02 | (2006.01) |
| H01L 27/04 | (2006.01) |
| H03K 19/00 | (2006.01) |

(52) U.S. Cl.
CPC ... *H03K 19/00384* (2013.01); *H01L 27/0251* (2013.01); *H01L 27/04* (2013.01); *H03F 3/181* (2013.01); *H03F 3/2171* (2013.01); *H03F 3/2173* (2013.01); *H03K 5/134* (2014.07); *H03K 19/0005* (2013.01)

(58) Field of Classification Search
CPC ............. H03K 19/00384; H03K 5/134; H03K 19/0005; H01L 27/0251; H01L 27/04

USPC ......................................................... 327/112
See application file for complete search history.

(56) References Cited

U.S. PATENT DOCUMENTS

| 6,046,627 A | 4/2000 | Itoh et al. |
|---|---|---|
| 6,366,141 B1 | 4/2002 | Chiba et al. |

(Continued)

FOREIGN PATENT DOCUMENTS

WO    WO 00/14870 A1    3/2000

OTHER PUBLICATIONS

Extended European Search Report dated Jun. 9, 2017 for corresponding EP Patent Application No. 16207327.4, 8 pages.

*Primary Examiner* — Dinh T Le
(74) *Attorney, Agent, or Firm* — Vista IP Law Group, LLP

(57) ABSTRACT

The present disclosure relates to an integrated circuit output driver, e.g. operating in class-D, for driving an audio transducer. The integrated circuit output driver comprises a first half-bridge driver comprising a first PMOS transistor and a first NMOS transistor connected in series between positive and negative supply voltage rails. A first body terminal is connected to a body of the first PMOS transistor for receipt of a first back bias voltage and a second body terminal connected to a body of the first NMOS transistor for receipt of a second back bias voltage. The integrated circuit output driver comprises a bias voltage generator configured to adjust at least one of the first back bias voltage and the second back bias voltage to control on-resistance of the first PMOS transistor and/or the first NMOS transistor. The integrated circuit output driver is well-suited for hearing aids, headsets and other audio devices.

30 Claims, 4 Drawing Sheets

(56) References Cited

U.S. PATENT DOCUMENTS

| | | | | |
|---|---|---|---|---|
| 7,822,214 B1* | 10/2010 | Melanson | ................ | H04R 3/04 |
| | | | | 381/100 |
| 9,473,135 B2* | 10/2016 | Garg | ................... | H03K 17/687 |
| 9,734,875 B2* | 8/2017 | Byeon | ................... | G11C 5/147 |
| 9,972,395 B2* | 5/2018 | Tran | ....................... | G11C 7/065 |
| 2005/0253191 A1* | 11/2005 | Pendharkar | ......... | H01L 29/0847 |
| | | | | 257/335 |
| 2007/0267701 A1* | 11/2007 | Sung | ................... | H01L 27/0266 |
| | | | | 257/365 |
| 2010/0052738 A1* | 3/2010 | Won | ....................... | H03K 23/54 |
| | | | | 327/117 |
| 2010/0321094 A1 | 12/2010 | Luo et al. | | |
| 2012/0182070 A1 | 7/2012 | Soussan et al. | | |

* cited by examiner

OUTPUT DRIVER COMPRISING MOS SWITCHES WITH ADJUSTABLE BACK BIASING

RELATED APPLICATION DATA

This application claims priority to, and the benefit of, European Patent Application No. 16207327.4, filed on Dec. 29, 2016, pending. The entire disclosure of the above application is expressly incorporated by reference herein.

FIELD

The present disclosure relates to an integrated circuit output driver, e.g. operating in class-D, for driving an audio transducer. The integrated circuit output driver comprises a first half-bridge driver comprising a first PMOS transistor and a first NMOS transistor connected in series between positive and negative supply voltage rails. A first body terminal is connected to a body of the first PMOS transistor for receipt of a first back bias voltage and a second body terminal connected to a body of the first NMOS transistor for receipt of a second back bias voltage. The integrated circuit output driver comprises a bias voltage generator configured to adjust at least one of the first back bias voltage and the second back bias voltage to control on-resistance of at least one of the first PMOS transistor and first NMOS transistor. The integrated circuit output driver is well-suited for use in hearing aids, headsets and similar compact and portable audio devices.

BACKGROUND

Integrated circuit output drivers, for example single-ended output drivers or differential/H-bridge output drivers, for driving audio transducers are known in the art. The design of such integrated circuit output drivers requires several tradeoffs to be carefully considered. The tradeoffs are semiconductor area consumption, power consumption and output impedance. The integrated circuit output driver may also need to support several impedance levels of the audio transducers to provide flexibility and adaptability to a particular application amongst a variety of applications. In hearing instrument applications, it would be advantageous if the output driver was capable of driving different types of receivers or miniature loudspeaker possessing different electrical impedances. High-power receivers which are capable of producing high sound pressure levels in the user's ear typically possess relatively low impedance while low-power receivers which typically produce relatively smaller sound pressure levels typically possess relatively high electrical impedance. It is difficult to achieve a satisfactory power conversion efficiency of the integrated circuit output driver when loaded by high-power receivers unless the output resistance or impedance of the output driver is very small as explained below in additional detail. Unfortunately, a small output resistance or impedance requires large transistor dimensions in the output driver which leads to a large chip or die area consumption. This increases manufacturing costs of the semiconductor substrate or chip.

SUMMARY

It would be desirable to have improved integrated circuit output drivers exhibiting reduced output resistance or impedance without undue increase of the chip or die area of the semiconductor substrate. It will also be advantageous to provide novel integrated circuit output drivers with increased flexibility and adaptability to particular load impedances supporting a broad range of impedance levels of audio transducers.

A first aspect relates to an integrated circuit output driver for driving an audio transducer. The integrated circuit output driver comprises:
a positive supply voltage rail and a negative supply voltage rail,
a first half-bridge driver comprising a first PMOS transistor and a first NMOS transistor connected in series between the positive and negative supply voltage rails to form a first driver output at interconnected drain terminals of the first PMOS and NMOS transistors,
a first body terminal connected to a body of the first PMOS transistor for receipt of a first back bias voltage and a second body terminal connected to a body of the first NMOS transistor for receipt of a second back bias voltage. The integrated circuit output driver additionally comprises a bias voltage generator configured to adjust at least one of the first back bias voltage and the second back bias voltage to control on-resistance of at least one of the first PMOS transistor and first NMOS transistor.

The audio transducer may comprise a miniature loudspeaker or moving armature receiver of a portable communication device such as hearing instrument. One end or terminal of the audio transducer is connected to the first driver output of the first half-bridge driver and a second terminal of the audio transducer may be connected to ground, or one of the DC voltage supply rails—for example via a DC blocking capacitor. In another embodiment, the second terminal of the audio transducer is connected to a complementary, or second, half-bridge driver of the integrated circuit output driver as discussed below in additional detail. An input of the integrated circuit output driver, e.g. respective gate terminals of the first PMOS transistor and first NMOS transistor, may be driven by a modulated audio input signal such as a pulse-width modulated (PWM) or pulse density modulated (PDM) input signal. Hence, the integrated circuit output driver functions as an output stage of a class D audio amplifier as discussed in additional detail below with reference to the appended drawings.

Another embodiment of the integrated circuit output driver comprises an H-bridge driver. This embodiment of the integrated circuit output driver accordingly comprises the second half-bridge driver wherein the second half-bridge driver comprises a PMOS transistor and an NMOS transistor connected in series between the positive and negative supply voltage rails to form a second driver output at interconnected drain terminals of the PMOS transistor and NMOS transistor. The second half-bridge driver also comprises a first body terminal connected to a body of the PMOS transistor for receipt of the first back bias voltage supplied by the bias voltage generator and a second body terminal connected to a body of the NMOS transistor for receipt of the second back bias voltage supplied by the bias voltage generator. Hence, the respective back bias voltages of the corresponding MOS transistors of the first and second half-bridge drivers may be identical to provide electrical symmetry between the first and second half-bridge drivers of the H-bridge. The second half-bridge driver of the H-bridge driver may be configured to operating in opposite phase to the first half-bridge driver. The first half-bridge driver and the second half-bridge driver may be nominally identical. The NMOS transistors and PMOS transistors of the first and second half-bridge drivers may in particular be nominally identical e.g. having same dimensions. In the H-bridge driver embodiment, the first end or terminal of the audio transducer may be connected to the first driver output of the first half-bridge driver and the second terminal is connected to a second driver output of the second half-bridge driver. Hence, providing a differential or complementary modulated drive signal to the audio transducer as discussed in additional detail below with reference to the appended drawings. The skilled person will appreciate that the circuit topology and component features and properties discussed herein with reference to the first half-bridge driver may apply to the second half-bridge driver as well.

The adjustable output impedance of the integrated circuit output driver is provided by the ability of the bias voltage generator to adjust one or both of the first back bias voltage of the first PMOS transistor and the second back bias voltage of the first NMOS transistor. This feature allows the integrated circuit output driver to be adapted or programmed to adequately drive a wide range of receivers or miniature loudspeakers such as the previously discussed low-power receivers and high-power receivers of hearing instruments, with relatively high efficiency, without unduly increasing the dimensions of the PMOS and NMOS transistors of the output driver. The first back bias voltage of the first PMOS transistor may for example be lowered with 500 mV or more from to the positive DC supply voltage and/or the second back bias voltage of the first NMOS transistor increased with 500 mV or more from to the negative DC supply voltage, e.g. ground in connection with driving low-impedance receivers.

The positive supply voltage rail may convey a positive DC supply voltage to the integrated circuit output driver relative to ground potential, GND, and the negative supply voltage rail may convey a lower DC supply voltage to the integrated circuit output driver. The skilled person will understand that the negative supply voltage rail may possess a DC voltage which is positive, albeit lower than the positive DC supply voltage. The negative supply voltage rail may have ground potential or a lower DC potential than ground, GND, in other embodiments. The negative supply voltage rail may for example deliver a negative DC supply voltage, relative to ground, for example with the same level as the positive DC supply voltage e.g. +/− minus 1.0 V.

According to one embodiment of the integrated circuit output driver, the bias voltage generator is configured to adjust the at least one of the first back bias voltage and the second back bias voltage between a plurality of fixed bias voltage levels or voltage steps. The bias voltage generator may be factory programmed to select one fixed bias voltage level, or two fixed bias voltage levels, for one or both of the first and second back bias voltages in connection with manufacturing of a portable communication device, e.g. a hearing instrument, utilizing the integrated circuit output driver. Hence, the programming of the desired fixed voltage level in connection with the manufacturing, the on-resistance of the at least one of the first PMOS transistor and first NMOS transistor can be adapted to the impedance characteristics of a particular audio transducer connected to the first driver output. According one such embodiment, the first back bias voltage may be set to the positive DC supply voltage and/or and the second back bias voltage may be set to the negative DC supply voltage. These settings may be adequate for driving the previously discussed type of high impedance receivers or loudspeakers where the inherent output resistance of the output driver may be sufficiently small to provide good power conversion efficiency. Consequently, the bias voltage generator may largely be turned-off or idling and in effect eliminate any noticeable power consumption of the bias voltage generator in its idling state.

The voltage difference between a maximum level and a minimum level of the plurality of fixed bias voltage levels may vary depending on a desired output resistance control range for a particular application and/or for a particular semiconductor process technology. Certain embodiments of the bias voltage generator may be configured to generate a larger voltage difference than 100 mV, more preferably larger than 200 mV, or larger than 500 mV, between the maximum and minimum voltage levels. Some embodiments of the bias voltage generator may be configured to generate more than 2 or 3 fixed bias voltage levels for one of both of the first back bias voltage and second back bias voltage—for example spaced apart with at least 100 mV or 200 mV.

The plurality of fixed bias voltage levels of the bias voltage generator may at least comprise:
a first voltage level equal to a DC voltage of the positive supply voltage rail, i.e. the positive DC supply voltage discussed above, and a second voltage level smaller than the DC voltage of the positive supply voltage rail. Alternatively, the first voltage level equal may be equal to a DC voltage of the negative supply voltage rail, i.e. the negative DC supply voltage discussed above, and a second voltage level at a fixed voltage exceeding the DC voltage of the negative supply voltage rail.

According to another embodiment of the integrated circuit output driver the bias voltage generator is configured to adjust the at least one of the first back bias voltage and the second back bias voltage continuously, i.e. within a continuous bias voltage range without stepping between fixed bias voltage levels, for example between an upper bias voltage limit and a lower bias voltage limit. The upper and lower bias voltage limits of the first back bias voltage may for example be 0 V and 1.5 V and the upper and lower bias voltage limits of the second back bias voltage may for example be 0.5 V and −0.5 V.

This embodiment of the bias voltage generator may comprise, or be operatively connected to, a feedback controller and a feedback loop which measures a control variable, such as current through, or power in, the audio transducer. Based on the measured value of the control variable, the feedback controller may adjust the at least one of the first back bias voltage and the second back bias voltage.

The integrated circuit output driver may comprise a controller configured to determining or measuring the current or power delivered to the load, e.g. audio transducer; The controller is configured to controlling the bias voltage generator to adaptively adjust the at least one of the first back bias voltage and the second back bias voltage based on the determined or measured load current or load power. The controller may comprise a digital state machine and/or a software programmable microprocessor or microcontroller. The skilled person will understand that the controller may be integrated with the integrated circuit output driver or may be a separate component of the integrated circuit. If the controller is a separate component of the integrated circuit, it may be integrated with the software programmable microprocessor for example comprising a set of executable program instructions and an analog or digital output port of the microprocessor. In the latter embodiments, the controller may generate and transmit a suitable control signal to a control input of the bias voltage generator to forcing the latter to select the appropriate level one or both of the first back bias voltage and the second back bias voltage.

The bias voltage generator may be configured to adaptively decrease the first back bias voltage of the first PMOS transistor for increasing load current or load power; and/or adaptively increase the second back bias voltage of the first NMOS transistor for increasing load current or load power. In both situations, the respective on-resistances of the first PMOS transistor and first NMOS transistor are decreasing with the increasing load current or load power such that power efficiency of the integrated circuit output driver remains high even when the load power is high, i.e. due to the decrease of output impedance of the driver as discussed below in additional detail.

Yet another embodiment of the first half-bridge driver comprises one or several switchable driver segments connectable in parallel with the first half-bridge driver. The one or several switchable driver segments can be switched between inactive states and active states for example depending on load current or power requirements. Hence, at large load currents, all switchable driver segments may be set to respective active states while fewer switchable driver segments are active at small load currents. According to this embodiment the first half-bridge driver comprises a first switchable driver segment comprising a second PMOS transistor and a second NMOS transistor connected in series between the positive and negative supply voltage rails wherein the second PMOS transistor comprises a body terminal for receipt of the first back bias voltage and the second NMOS transistor comprises a body terminal for receipt of second back bias voltage. The first half-bridge driver additionally comprises a first controllable switch arrangement configured to:

connect the second PMOS transistor and second NMOS transistor in parallel with the first PMOS transistor and first NMOS transistor in an active state of the switchable driver segment and disconnect the second PMOS transistor and second NMOS transistor from the first PMOS transistor and first NMOS transistor in an inactive state of the switchable driver segment.

One embodiment of the first half-bridge driver which comprises the one or several switchable driver segments reduces leakage current through the PMOS and NMOS transistors of inactive driver segments by connecting their respective body terminals to relatively high or low reference voltages through the first controllable switch arrangement. The first controllable switch arrangement may be configured to:

in the inactive state of the first switchable driver segment: connect the body terminal of the second PMOS transistor to a first DC reference voltage and connect the body terminal of the second NMOS transistor to a second DC reference voltage;

where the first DC reference voltage exceeds the DC voltage of the positive supply voltage rail and the second DC reference voltage is lower than the DC voltage of the negative supply voltage rail.

The integrated circuit output driver may be integrated on a semiconductor substrate or chip fabricated in different types of CMOS technology for example fully depleted Silicon on Insulator (FD SOI) processes or partly depleted Silicon on Insulator (PD SOI) processes. These CMOS technologies allow significant voltage adjustments of the respective back bias voltages of the NMOS and PMOS transistors of the output driver due to the increased isolation between respective channels and back-gates of the NMOS and PMOS transistors. Hence, the respective on-resistances of the NMOS and PMOS transistors of the output driver may be controlled across a wide resistance range.

Consequently, one embodiment of the integrated circuit output driver is arranged on, i.e. fabricated on, a fully depleted Silicon on Insulator (FD SOI) semiconductor substrate or a partially depleted Silicon on Insulator (PD SOI) semiconductor substrate. The fully or partially depleted Silicon on Insulator substrate comprises a standard well structure which structure comprises at least one N-well comprising the first PMOS transistor of the first half-bridge driver, said least one N-well being connected to the first body terminal for receipt of the first back bias voltage; and a least one P-well comprising the first NMOS transistor of the first half-bridge driver, said least one P-well being connected to the second body terminal for receipt of the second back bias voltage as discussed in additional detail below with reference to the appended drawings.

An alternative embodiment of the fully or partially depleted Silicon on Insulator substrate comprises a flip-well structure. The flip-well structure comprises at least one N-well comprising the NMOS transistor of the first half-bridge driver, said least one N-well being connected to the second body terminal for receipt of the second back bias voltage. The at least one P-well comprising the PMOS transistor of the first half-bridge driver, said least one P-well being connected to the first body terminal for receipt of the first back bias voltage; and a deep n-well diffusion arranged below the at least one P-well as discussed in additional detail below with reference to the appended drawings.

Yet another embodiment of the present the integrated circuit output driver is integrated on a bulk CMOS process using a double-well structure to support separately and flexibly adjustable back bias voltages for the PMOS transistors and NMOS transistors of the first half-bridge driver and/or the second half-bridge driver.

A second aspect relates to a method of controlling output resistance of an integrated circuit half-bridge driver, wherein the method comprises:

supplying a positive DC supply voltage to a source terminal of a PMOS transistor of the half-bridge driver, supplying a negative DC supply voltage to a source terminal of an NMOS transistor of the half-bridge driver, generating a first back bias voltage and applying the first back bias voltage to a body of the PMOS transistor, generating a second back bias voltage and supplying the second back bias voltage to a body of the NMOS transistor, adjusting at least one of the first back bias voltage and second back bias voltage for controlling an on-resistance of at least one of the PMOS transistor and NMOS transistor.

One embodiment of the present methodology of controlling output resistance of an integrated circuit half-bridge driver additionally comprises:

connecting a load to an output node of the half-bridge driver, determining or measuring a load current or load power delivered to the load, adjusting at least one of the first back bias voltage and second back bias voltage based on the determined or measured load current or load power.

Yet another embodiment of the methodology of controlling output resistance of an integrated circuit half-bridge driver comprises the use of an H-bridge output driver to deliver a differential or complementary modulated drive signal to the respective output nodes of the first and second half-bridge drivers for application to the load. The second half-bridge driver may be driven in the same manner as the first half-bridge driver albeit in opposite phase as discussed above.

The load may comprise an audio transducer in accordance with the previous disclosure.

A third aspect relates to a hearing instrument which comprises a control and processing circuit. The control and processing circuit comprising:

a first audio input channel for receipt of a first audio signal, a signal processor for receipt and processing of the first audio signal for generating a compensated microphone signal according to a hearing loss of a user;
a class D output amplifier for receipt of the compensated microphone signal and generation of an amplified or buffered output signal for application to a miniature receiver or loudspeaker of the hearing instrument; wherein
the class D output amplifier comprises an integrated circuit output driver according to any of previously discussed embodiments thereof.

The signal processor may comprise the previously discussed one or more logic circuit regions where each logic circuit region comprises a regional clock network for supplying a regional clock signal to each logic circuit region and an associated clock gating circuit configured to derive the regional clock signal from a master clock signal of the integrated circuit and selectively apply and interrupt each regional clock signal in accordance with a dedicated state select signal associated with the logic circuit region in question. Hence, each region of multiple logic circuit regions may be switched between its active state and inactive state by a dedicated state select signal.

The signal processor of the hearing instrument may comprise dedicated digital logic circuitry, a software programmable processor or any combination thereof. As used herein, the terms "processor", "signal processor", "controller", "system", etc., are intended to refer to microprocessor or CPU-related entities, either hardware, a combination of hardware and software, software, or software in execution. For example, a "processor", "signal processor", "controller", "system", etc., may be, but is not limited to being, a process running on a processor, a processor, an object, an executable file, a thread of execution, and/or a program. By way of illustration, the terms "processor", "signal processor", "controller", "system", etc., designate both an application running on a processor and a hardware processor. One or more "processors", "signal processors", "controllers", "systems" and the like, or any combination hereof, may reside within a process and/or thread of execution, and one or more "processors", "signal processors", "controllers", "systems", etc., or any combination hereof, may be localized on one hardware processor, possibly in combination with other hardware circuitry, and/or distributed between two or more hardware processors, possibly in combination with other hardware circuitry. Also, a processor (or similar terms) may be any component or any combination of components that is capable of performing signal processing. For examples, the signal processor may be an ASIC processor, a FPGA processor, a general purpose processor, a microprocessor, a circuit component, or an integrated circuit.

An output driver for driving an audio transducer, includes: a positive supply voltage rail and a negative supply voltage rail; a first half-bridge driver comprising a first PMOS transistor and a first NMOS transistor connected in series between the positive and the negative supply voltage rails to form a first driver output; a first body terminal connected to a body of the first PMOS transistor for receipt of a first back bias voltage; a second body terminal connected to a body of the first NMOS transistor for receipt of a second back bias voltage; and a bias voltage generator configured to adjust at least one of the first back bias voltage and the second back bias voltage to control on-resistance of at least one of the first PMOS transistor and first NMOS transistor.

Optionally, the bias voltage generator is configured to adjust the at least one of the first back bias voltage and the second back bias voltage between a plurality of fixed bias voltage levels.

Optionally, the plurality of fixed bias voltage levels comprises at least: a first voltage level equal to a DC voltage of the positive supply voltage rail, and a second voltage level smaller than the DC voltage of the positive supply voltage rail.

Optionally, the plurality of fixed bias voltage levels comprises at least: a first voltage level equal to a DC voltage of the negative supply voltage rail, and a second voltage level at a fixed voltage exceeding the DC voltage of the negative supply voltage rail.

Optionally, a voltage difference between a maximum level and a minimum level of the plurality of fixed bias voltage levels is larger than 100 mV.

Optionally, the bias voltage generator is configured to adjust the at least one of the first back bias voltage and the second back bias voltage continuously between an upper bias voltage limit and a lower bias voltage limit.

Optionally, the output driver further includes a controller configured to: determine or measure a load current or a load power of a load; and control the bias voltage generator to adaptively adjust the at least one of the first back bias voltage and the second back bias voltage based on the determined or measured load current or load power.

Optionally, the bias voltage generator is configured to: decrease the first back bias voltage of the first PMOS transistor for increasing the load current or the load power; and/or increase the second back bias voltage of the first NMOS transistor for increasing the load current or the load power.

Optionally, the output driver further includes: a second half-bridge driver having a second PMOS transistor and a second NMOS transistor connected in series between the positive and the negative supply voltage rails to form a second driver output at interconnected drain terminals of the second PMOS transistor and the second NMOS transistor; a third body terminal connected to a body of the second PMOS transistor for receipt of the first back bias voltage; and a fourth body terminal connected to a body of the second NMOS transistor for receipt of the second back bias voltage.

Optionally, the first half-bridge driver comprises a first switchable driver segment comprising: a second PMOS transistor and a second NMOS transistor connected in series between the positive and negative supply voltage rails, wherein the second PMOS transistor comprises a third body terminal for receipt of the first back bias voltage, and the second NMOS transistor comprises a fourth body terminal for receipt of second back bias voltage; a first controllable switch arrangement configured to: connect the second PMOS transistor and second NMOS transistor in parallel with the first PMOS transistor and the first NMOS transistor in an active state of the first switchable driver segment, and disconnect the second PMOS transistor and second NMOS transistor from the first PMOS transistor and first NMOS transistor in an inactive state of the first switchable driver segment.

Optionally, the first controllable switch arrangement is configured to: in the inactive state of the first switchable driver segment: connect the third body terminal of the second PMOS transistor to a first DC reference voltage, and connect the fourth body terminal of the second NMOS transistor to a second DC reference voltage; wherein the first DC reference voltage exceeds a DC voltage of the positive supply voltage rail, and the second DC reference voltage is lower than a DC voltage of the negative supply voltage rail.

Optionally, the output driver is integrated on a fully depleted Silicon on Insulator (FD SOI) semiconductor substrate or a partially depleted Silicon on Insulator (PD SOI) semiconductor substrate.

Optionally, the fully or partially depleted Silicon on Insulator substrate comprises a standard well structure, the standard well structure comprising: at least one N-well comprising the first PMOS transistor of the first half-bridge driver, the at least one N-well being connected to the first body terminal for receipt of the first back bias voltage; and a least one P-well comprising the first NMOS transistor of the first half-bridge driver, the at least one P-well being connected to the second body terminal for receipt of the second back bias voltage.

Optionally, the fully or partially depleted Silicon on Insulator substrate comprises a flip-well structure, the flip-well structure comprising: at least one N-well comprising the first NMOS transistor of the first half-bridge driver, the at least one N-well being connected to the second body terminal for receipt of the second back bias voltage; and at least one P-well comprising the first PMOS transistor of the first half-bridge driver, the at least one P-well being connected to the first body terminal for receipt of the first back bias voltage; and a n-well diffusion arranged below the at least one P-well.

Optionally, the first driver output is formed at interconnected drain terminals of the first PMOS transistor and the first NMOS transistor.

A hearing instrument includes: a processing circuit, the processing circuit having a first audio input channel for receipt of a first audio signal, a signal processor for receipt and processing of the first audio signal for generating a compensated microphone signal according to a hearing loss of a user; and a class D output amplifier for receipt of the compensated microphone signal and generation of an amplified or buffered output signal for application to a receiver or loudspeaker of the hearing instrument; wherein the class D output amplifier comprises the output driver.

A method of controlling output resistance of a half-bridge driver, includes: supplying a positive DC supply voltage to a source terminal of a PMOS transistor of the half-bridge driver; supplying a negative DC supply voltage to a source terminal of an NMOS transistor of the half-bridge driver; generating a first back bias voltage and applying the first back bias voltage to a body of the PMOS transistor; generating a second back bias voltage and applying the second back bias voltage to a body of the NMOS transistor; and adjusting at least one of the first back bias voltage and second back bias voltage for controlling an on-resistance of at least one of the PMOS transistor and the NMOS transistor.

Optionally, the method further includes: connecting a load to an output node of the half-bridge driver; determining or measuring a load current or load power delivered to the load; and adjusting at least one of the first back bias voltage and second back bias voltage based on the determined or measured load current or load power.

Other features and advantageous will be described in the detailed description.

BRIEF DESCRIPTION OF THE DRAWINGS

Embodiments will be described in more detail in connection with the appended drawings, in which.

DETAILED DESCRIPTION

Figure 1:
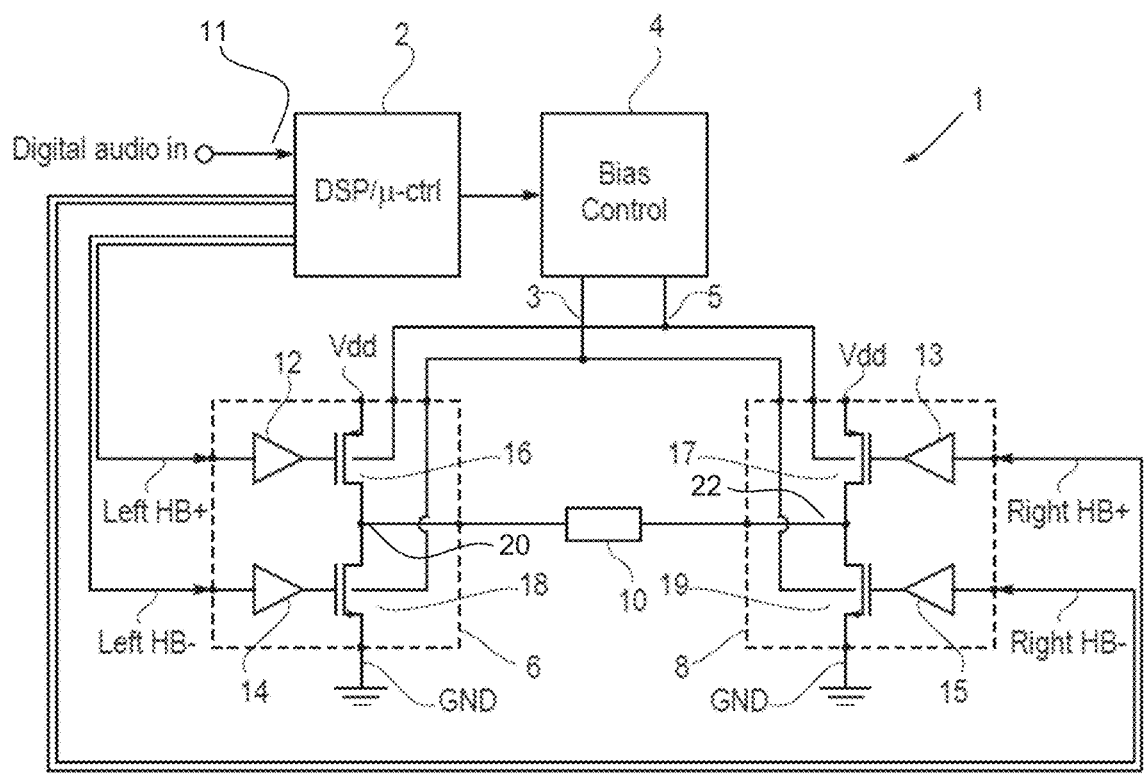
FIG. 1 shows a simplified schematic block diagram of an exemplary integrated circuit output driver for driving a loudspeaker in accordance with a first embodiment.

In the following various exemplary embodiments of the present integrated circuit output driver are described with reference to the appended drawings. It should be noted that elements of similar structures or functions are represented by like reference numerals throughout the figures. Like elements or components will therefore not necessarily be described in detail with respect to each figure. The skilled person will further appreciate that certain actions and/or steps may be described or depicted in a particular order of occurrence while those skilled in the art will understand that such specificity with respect to sequence is not actually required. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated.

FIG. 1 shows a simplified schematic block diagram of an integrated circuit output driver 1 for driving an audio transducer 10 such as a miniature loudspeaker or receiver of a portable communication device such as hearing instrument. The integrated circuit output driver 1 comprises a positive supply voltage rail Vdd configured for supplying a positive DC supply voltage to a first half-bridge driver 6 and to a second half-bridge driver 8. The integrated circuit output driver 1 furthermore comprises a negative supply voltage rail GND configured for supplying a negative DC supply voltage to the first half-bridge driver 6 and to the second half-bridge driver 8. The skilled person will understand that the negative DC supply voltage may have another DC potential than ground, GND, in other embodiments. The negative DC supply voltage may for example be a negative DC voltage, relative to ground, with the same magnitude as the positive DC supply voltage e.g. supplying the positive and negative DC supply voltages as +/−1.0 V.

The first half-bridge driver 6 comprises a first PMOS transistor 16 and a first NMOS transistor 18 connected in series between the positive and negative supply voltage rails Vdd and GND. Hence, the drain terminals of the first PMOS and NMOS transistors 16, 18 are interconnected and form a first driver output 20 or output node or terminal. The second half-bridge driver 8 comprises a second PMOS transistor 17 and a second NMOS transistor 19 connected in series between the positive and negative supply voltage rails Vdd and GND. Hence, the drain terminals of the second PMOS and NMOS transistors 17, 19 are interconnected and form a second driver output 22 or output node or terminal. The first half-bridge driver 6 and second half-bridge driver 8 jointly forms an H-bridge output driver where the audio transducer 10 is connected between the first driver output 20 and the second driver output 22 for receipt of a modulated drive signal in differential format, i.e. the modulated drive signal is applied across opposite terminals of the audio transducer 10. This feature is advantageous in several situations because of the suppression of DC components in the modulated drive signal even when the negative DC supply voltage is at GND.

A modulated input signal for the first half-bridge driver 6 may be supplied by a suitable pulse-width modulator (PWM) or pulse density modulator (PDM) generating two distinct phases Left HB+ and Left HB− of the modulated input signal. The PWM or PDM modulator (not shown) may be integrated within a microcontroller 2 connected to, or integrated within, the integrated circuit output driver 1. The modulated input signal is derived from a digital audio signal 11 by the PWM or PDM modulator 2. The skilled person will appreciate that for hearing instrument applications of the present integrated circuit output driver 1, the digital audio signal 11 may comprise a compensated microphone signal. This compensated microphone signal may have been derived from a microphone arrangement of the hearing instrument and processed according to a hearing loss of the hearing instrument user. The two distinct phases Left HB+ and Left HB− are applied to respective ones of the first PMOS transistor 16 and first NMOS transistor 18 to switch these between respective on-states and off-states. The two distinct phases Left HB+ and Left HB− are preferably in opposite phase and non-overlapping to prevent cross-conduction currents through the first PMOS and NMOS transistors 16 18. A corresponding modulated input signal for the second half-bridge driver 8 is also generated and supplied by the PWM or PDM modulator 2 by generating two further distinct phases Right HB+ and Right HB− of the modulated input signal. The two distinct phases Right HB+ and Right HB− are applied to respective ones of the second PMOS transistor 17 and the second NMOS transistor 19 to switch these between respective on-states and off-states in opposite phase. Optional buffers 12, 14 are inserted between the phases Left HB+ and Left HB− and respective gate terminals of the first PMOS transistor 16 and first NMOS transistor 18. Likewise, optional buffers 13, 15 are inserted between the phases Right HB+ and Right HB− and respective gate terminals of the first PMOS transistor 17 and first NMOS transistor 19 of the second half-bridge driver 8. These buffers 12, 13, 14, 15 are often needed to provide sufficient current drive to the typically large gate capacitance of each of the PMOS transistors and NMOS transistors 16, 17, 18, 19.

The PWM or PDM modulator 2 is also configured to generate the corresponding phases Right HB+ and Right HB− of the modulated input signals in opposite phase and likewise generate phases Left HB+ and Left HB− in opposite phase. Consequently, the first PMOS transistor 16 and the second NMOS transistor 19 are simultaneously conducting, i.e. in on-states, in a first phase of the modulated drive signal to pull the first driver output 20 to Vdd and the second driver output 22 to GND. In a second phase of the modulated drive signal, the first PMOS transistor 16 and the second NMOS transistor 19 are simultaneously non-conducting, i.e. in off-states while the second PMOS transistor 17 and the second NMOS transistor 19 are conducting to pull the first driver output 20 to GND and the second driver output 22 to Vdd. Hence, the audio transducer 10 is alternatingly switched between GND and Vdd at the carrier or switching frequency of the modulated drive signal. The carrier frequency of the modulated drive signal may for example lie between 250 kHz and 2 MHz depending on the particular type of modulation utilized by the PWM or PDM modulator 2 and other design considerations such as capacitive switching losses and high-frequency impedance characteristics of the audio transducer 10.

Each of the first and second PMOS transistors 16, 17 of the H-bridge output driver comprises body terminal connected to a body of the PMOS transistor for receipt of a first back bias voltage 5 generated by a bias voltage generator 4. The skilled person will understand that the first back bias voltage 5 may be supplied to the respective body terminals of the and second PMOS transistors 16, 17 by a suitable grid or wire disposed on or in a suitable layer of the semiconductor substrate. Each of the first and second NMOS transistors 18, 19 of the H-bridge output driver likewise comprises body terminal connected to a body of the NMOS transistor for receipt of a second back bias voltage 3 generated by the bias voltage generator 4. The skilled person will understand that the second back bias voltage 5 may be supplied to the respective body terminals of the first and second NMOS transistors 18, 19 by a suitable grid or wire disposed on or in a suitable layer of the semiconductor substrate.

The bias voltage generator 4 is configured to adjust at least one, and preferably both, of the first and second back bias voltages 3, 5, respectively. By adjusting the respective back bias voltages of the PMOS or NMOS transistor it is possible to control an on-resistance of the PMOS or NMOS transistor in question leading to several desirable properties of the present integrated circuit output driver 1. In particular where the integrated circuit output driver 1 is integrated on a fully depleted Silicon on Insulator (FD SOI) semiconductor substrate or a partially depleted Silicon on Insulator (PD SOI) semiconductor substrate where high back-biasing voltages are available for the NMOS and PMOS transistors. Using FD SOI semiconductor substrates or PD SOI semiconductor substrates allows the adjustment of the first and second back bias voltages 3, 5 to have a large impact on leakage current of the PMOS and NMOS transistors. The first back bias voltage 3 may be raised to a level above the DC voltage of the positive supply rail Vdd by the bias voltage generator 4 under certain circumstances to reduce leakage current and power. The second back bias voltage 5 may be lowered to a level below the negative supply rail GND by the bias voltage generator 4 under these certain circumstances.

The adjustment of the first and second back bias voltages 3, 5 also has a large impact on the respective on-resistances of the PMOS and NMOS transistors of the H-bridge output driver by either increasing or decreasing the respective threshold voltages of the PMOS and NMOS transistors relative to their respective threshold voltages when the body terminals are at the positive and negative supply voltage rails Vdd and GND, respectively. The adjustment of the first and second back bias voltages 3, 5 are carried out by the bias voltage generator 4 which may include programmable DC voltage generators for independently controlling and setting the first and second back bias voltages 3, 5 as explained in additional detail below with reference to FIG. 2 and FIG. 3. In some embodiments, the bias voltage generator 4 may include appropriate digital logic circuitry, e.g. configured as a state-machine, to determine and modify settings of the first and second back bias voltages 3, 5. In other embodiments, the settings of the first and second back bias voltages 3, 5 may be determined by an external controller such as the previously mentioned microcontroller 2 in conjunction with appropriate program code or software. The microcontroller 2 may for example comprise a hard-wired or software programmable Digital Signal Processor. In the latter embodiment, the microcontroller 2 may determine the settings of the first and second back bias voltages 3, 5 and communicate these to the bias voltage generator 4 via a suitable programming interface or port S<n:0> as illustrated on FIG. 2. Hence, the bias voltage generator 4 acts as a slave to the microcontroller 2 implementing the desired settings of the first and second back bias voltages 3, 5 as set by the microcontroller 2.

According to one embodiment, the bias voltage generator 4 comprises a plurality of fixed bias voltage levels. The bias voltage generator 4 is factory programmed to select one fixed bias voltage level, or two fixed bias voltage levels, for one or both of the first and second back bias voltages 3, 5 during manufacturing of the portable communication device holding the integrated circuit output driver 1. The fixed voltage level(s) of one or both of the first and second back bias voltages 3, 5 thereafter remain fixed during operation of the integrated circuit output driver 1. The factory-setting of the fixed bias voltage levels of the first and second back bias voltages 3, 5 may be dependent on an impedance of the miniature loudspeaker or receiver 10 connected to the outputs 20, 22 of the integrated circuit output driver 1. This impedance of the miniature loudspeaker 10 is known during fabrication of the portable communication device. The voltage of the first back bias voltage 3 may for example be factory-programmed to a lower voltage where the miniature loudspeaker 10 has relatively low impedance compared to the situation where the miniature loudspeaker 10 has relatively high impedance. Utilizing the corresponding mechanism for the NMOS transistors 18, 19, the voltage of the second back bias voltage 3 may for example be programmed to a higher voltage where the miniature loudspeaker 10 has relatively low impedance than where the miniature loudspeaker 10 has relatively high impedance. The relative decrease of the first back bias voltage 3, and optionally relative increase of the second back bias voltage 5, leads to a reduced on-resistance of the PMOS transistors and NMOS transistors. The reduced on-resistances in turn lead to improved energy/power efficiency of the H-bridge output driver compared to higher, e.g. default, back bias voltages, which may be equal to the positive and negative DC supply voltages, because the worst case efficiency of the H-bridge output driver, typically at relatively low audio frequencies, can be approximated by:

$$\frac{R_{load}}{(R_{load} + 2 \cdot R_{on})}$$

where $R_{on}$ represents the on-resistance of one of the PMOS and

NMOS transistors 16, 17, 18, 19 when assuming equal resistance of these transistors for simplicity. $R_{load}$ represents the DC, i.e. 0 Hz, resistance of the miniature loudspeaker 10.

Consequently, a small on-resistance, $R_{on}$, of the PMOS or NMOS transistors 16, 17, 18, 19 of the H-bridge output driver is desirable for power efficiency reasons. Unfortunately, such low $R_{on}$ values require large transistor dimensions leading to large area consumption on the semiconductor substrate or chip which in turs leads to higher manufacturing costs. Hence, by adjusting the first and second back bias voltages of the PMOS transistors 16, 17 and NMOS transistors 18, 19 as outlined above, the respective on-resistances can adjusted, e.g. lowered, in a highly flexible and programmable manner. According to one exemplary embodiment, the voltage or level of the first back bias voltage 3 is at least 250 mV, for example at least 500 mV, lower than the positive DC supply voltage. The positive DC supply voltage may for example lie between 1.0 V and 1.2 V relative to GND. Likewise, the voltage or level of the second back bias voltage 5 is at least 250 mV, for example at least 500 mV, higher than the negative DC supply voltage, e.g. ground.

Conversely, where the miniature loudspeaker or receiver 10 has relatively high impedance, the bias voltage generator 4 may be configured or programmed to set the first and second back bias voltages substantially equal to the positive and negative DC supply voltages, respectively. In this embodiment, the bias voltage generator 4 may be turned-off and the body terminals of the PMOS transistors 16, 17 connected to the positive supply voltage rail Vdd and the body terminals of the NMOS transistors 16, 17 connected to the negative supply voltage rail GND.

The bias voltage generator 4 may of course in the alternative set the first back bias voltage to a level exceeding the positive DC supply voltage and set the second back bias voltage to a level below the negative DC supply voltage which voltage level settings will further increase the respective on-resistances of the PMOS or NMOS transistors 16, 17, 18, 19 of the H-bridge output driver, but on the other hand decrease leakage currents through these PMOS or NMOS transistors. The increase of respective on-resistances of the PMOS or NMOS transistors 16, 17, 18, 19 may be acceptable to the extent that the low-frequency resistance $R_{load}$ of the miniature loudspeaker 10 is still significantly larger than $2*R_{on}$.

According to yet another embodiment of the integrated circuit output driver 1, the bias voltage generator 4 is configured to adjust at least one of the first back bias voltage 3 and the second back bias voltage 5 continuously over time during operation of the H-bridge output driver, i.e. during the application of audio signals to the miniature loudspeaker or receiver 10. The bias voltage generator 4 may be configured to adjust the at least one of the first back bias voltage 3 and the second back bias voltage 5 between an upper bias voltage limit and a lower bias voltage limit. According to this embodiment, the microprocessor 2 may be configured to measuring or estimating a load current or load power delivered to the miniature loudspeaker or receiver 10 and controlling the bias voltage generator 4 and adaptively adjust the at least one of the first back bias voltage 3 and second back bias voltage 5 based on the determined or measured load current or load power. Consequently, adaptively adjusting the at least one of the first back bias voltage 3 and second back bias voltage 5 in accordance with a level or amplitude of the audio signal applied to the miniature loudspeaker or receiver 10. The bias voltage generator may for example be configured to decrease the back bias voltage 3 of the PMOS transistors 16, 17 for increasing load current or load power and vice versa. The bias voltage generator may additionally, or alternatively, be configured to increase the back bias voltage 5 of the NMOS transistors 18, 19 for increasing load current or load power and vice versa. These back bias voltage regulation schemes or mechanisms lead to a relatively small output resistance of the H-bridge output driver at large audio levels of the modulated drive signal as applied to the miniature loudspeaker or receiver 10 through the output terminals 20, 22. Hence, leading to high power conversion efficiency of the H-bridge output driver at high output sound pressures of the miniature loudspeaker or receiver 10. In contrast, when the measured or estimated load current or load power is relatively small, the corresponding output sound pressure is also low, and the first back bias voltage 3 and second back bias voltage 5 may be set to the positive DC supply voltage and the negative DC supply voltage, respectively, to minimize leakage current through the PMOS or NMOS transistors 16, 17, 18, 19 and possibly switching off the bias voltage generator 4 to achieve a yet further reduction of current consumption of the integrated circuit output driver 1 under these circumstances, i.e. small audio amplitude of the modulated drive signal and correspondingly low output sound pressure of the miniature loudspeaker or receiver 10.

The adaptive adjustment of the at least one of the first back bias voltage 3 and second back bias voltage 5 in accordance with the level or amplitude of the audio signal may introduce a certain amount of distortion into the audio signal applied to the miniature loudspeaker or receiver 10 due to the non-linearity, i.e. level dependence, of the output resistance of the H-bridge output driver. However, this non-linearity may be compensated by applying suitable inverse pre-distortion to the digital audio signal 11 by the microcontroller 2, in particular where the latter comprises the hard-wired or software programmable Digital Signal Processor. The characteristics of this inverse pre-distortion may be determined by a calibration process carried out in connection with manufacturing of the portable communication device holding the integrated circuit output driver 1.

While the above-discussed embodiments of the present integrated circuit output driver 1 are integrated on FD SOI or PD manufactured semiconductor substrate, the skilled person will appreciate that alternative embodiments of the integrated circuit output driver 1 may be fabricated in double-well bulk CMOS technology where each of the first and second back bias voltages also may be adjusted over a useful voltage range and thereby adjust the output resistance of the H-bridge output driver.

Figure 2:
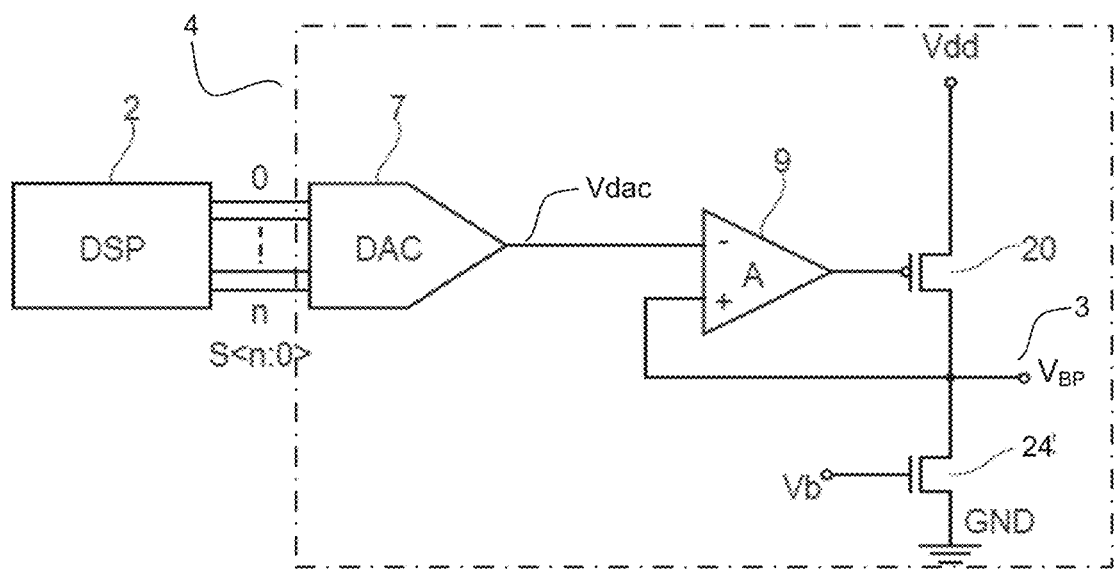
FIG. 2 shows a simplified schematic block diagram of a programmable bias voltage generator delivering an adjustable body voltage for NMOS and/or PMOS transistors of the output driver.

FIG. 2 shows a simplified schematic block diagram of an exemplary embodiment of the previously discussed bias voltage generator 4 configured to deliver respective programmable or adjustable first and second back bias voltages for at least one of the PMOS or NMOS transistors 16, 17, 18, 19 of the H-bridge output driver shown in FIG. 1. The simplified schematic block diagram merely shows circuitry for generation of a single adjustable back bias voltage $V_{BP}$ but the skilled person will understand that the bias voltage generator 4 may comprise corresponding circuitry for generation of one or more additional independent back bias voltages—for example for additional MOS transistors of the output driver 1 such as the NMOS transistors of the present H-bridge output driver. The bias voltage generator 4 comprises a D/A converter 7 having an digital input port of receipt of a bias voltage code S<0:n> transmitted by the microprocessor 2 or controller for example from a suitable output port of the microprocessor 2 or controller. The number of bits (n+1) of the bias voltage code S<0:n> determines a resolution of the adjustable back bias voltage $V_{BP}$. The output voltage Vdac of the D/A converter 7 is applied to a buffer circuit comprising operational amplifier 9 and buffer transistor 20 for example a PMOS transistor with suitable current supply capability to drive the load applied to the back bias voltage $V_{BP}$ on terminal or wire 3. This load comprises inter alia parasitic capacitances associated with the body terminals of the PMOS transistors 16, 17 and associated wiring thereto.

An NMOS transistor 24 is coupled in series with the buffer transistor 20 and allows the adjustable back bias voltage $V_{BP}$ to be pulled down to the voltage of the negative supply rail, ground in the present embodiment, by switching the NMOS transistor 24 to a conducting state via gate control signal Vb. The feedback arrangement extending from the back bias voltage $V_{BP}$ and back to the non-inverting terminal of the operational amplifier 9 ensures that back bias voltage $V_{BP}$ is essentially identical to the output voltage Vdac. Hence, allowing accurate setting of the adjustable back bias voltage $V_{BP}$.

Figure 3:
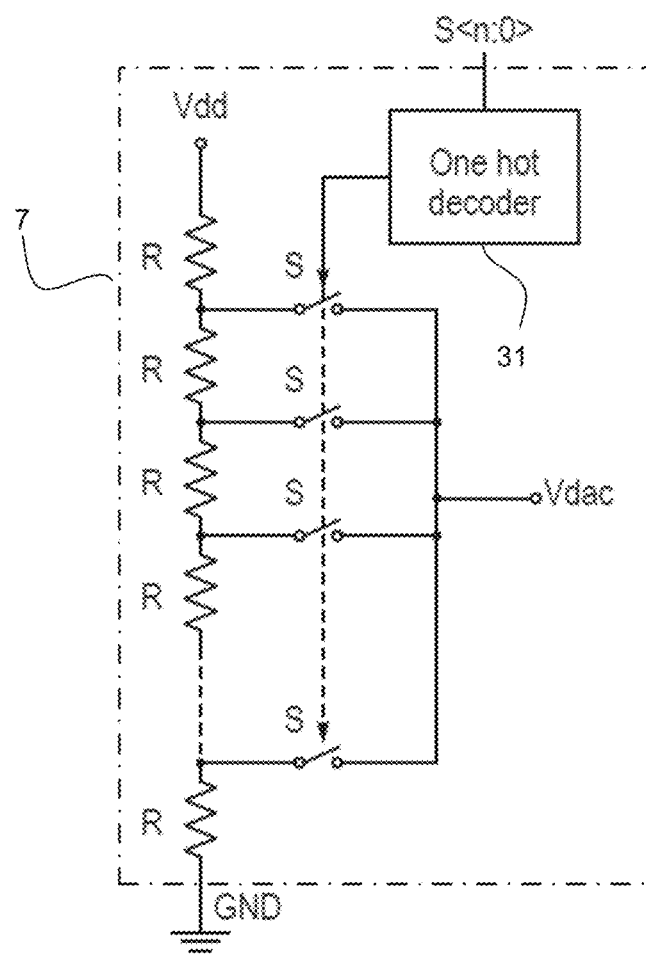
FIG. 3 shows a detailed circuit diagram of a DAC portion of the programmable bias voltage generator.

FIG. 3 shows a schematic circuit diagram of the D/A converter 7. The D/A converter 7 comprises a resistive voltage divider comprising a plurality of series connected resistors R connected between the positive and negative supply voltage rails Vdd and GND. Other embodiments of the D/A converter 7 may use different types of impedance elements to provide a voltage divider for example a corresponding string of series connected capacitors. A plurality of tapping nodes are interposed between the plurality of series connected resistors R to provide respective output voltages Vdac of the D/A converter 7. The number of series connected resistors R utilized in a particular design of the D/A converter 7 typically varies according to a desired output voltage resolution of the D/A converter 7 and may for example lie between 4 and 32. The plurality of series connected resistors R, i.e. resistor string, may have nominally identical resistance or nominally different resistances. The output voltage Vdac may be set to any available voltage divider ratio available from the intermediate nodes of the plurality of series connected resistors R by suitable setting or programming of the bias voltage code S<0:n> applied to an "one hot decoder" 31. The one hot decoder 31 selects the appropriate output node of the resistor string by closing the appropriate select switch S and leaving the residual select switches in off-state or open such that exclusively the selected node voltage is conveyed to the output voltage Vdac.

The skilled person will appreciate that other embodiments of the D/A converter 7 may include higher and lower voltages than the positive and negative supply voltage rails Vdd and GND, respectively, applied to the opposite ends of the resistor string. This may enable the output voltage Vdac to exceed one or both of the positive and negative supply voltage rails Vdd and GND, respectively, to provide even wider voltage ranges of the first and second back bias voltages.

Figure 4A:
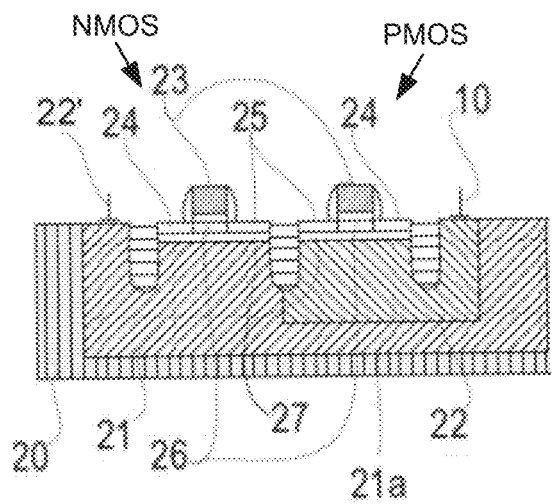
FIGS. 4A and 4B show cut-through and top-view transistor layouts, respectively, of a half-bridge driver portion of the integrated circuit output driver integrated in a so-called standard well FD SOI process.
Figure 4B:
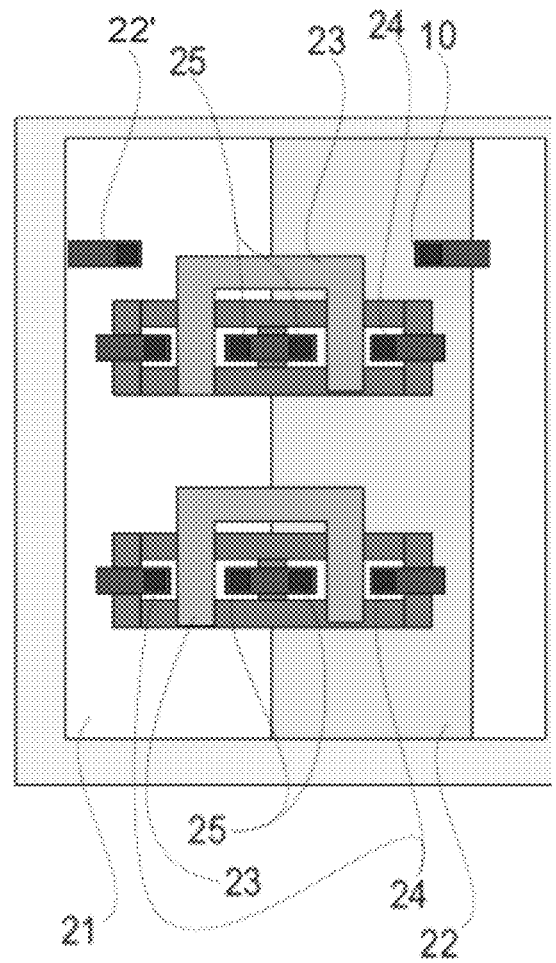

FIG. 4A is a vertical cut-through view of an exemplary layout of the previously discussed PMOS and NMOS transistors 16, 17, 18, 19 of the first half-bridge driver 6 or second half-bridge driver 8 of the H-bridge output driver of the integrated circuit 1, as shown in FIG. 1, integrated in a so-called standard well FD SOI process. The skilled person will appreciate that the illustrated transistor layout is schematic since practical implementations of the NMOS and PMOS transistors of the half-bridge driver 6 will possess larger dimensions. The PMOS transistor 16 is arranged in a N-well diffusion 21 of a P-polarity semiconductor substrate 20 and the NMOS transistor 18 is arranged in a P-Well diffusion or region 22. The P-well diffusion or region 22 is arranged at least partly within the N-well diffusion 21. Finally, a deep N-well 21a diffusion if formed vertically below the P-well diffusion 22 abutting the N-well diffusion 21. The gate terminal 23 of the PMOS transistor and the gate terminal 23 of the NMOS transistor may in some embodiments be electrically connected via a polysilicon gate layer 23 to form a common input terminal output stage as illustrated on FIG. 4B. In other embodiments, the gate terminals 23 of the PMOS and NMOS transistors are unconnected such that each MOS transistor can be separately controlled by an appropriate phase signal as illustrated on FIG. 1. The drain terminal 25 of the PMOS transistor and the drain terminal 25 of the NMOS transistor are electrically connected via a metal layer to form the output terminal 20 (or node 22 for the second half-bridge driver) of the first half-bridge driver 6 as illustrated on FIG. 1. Respective gate oxides are arranged below the gate terminals 23 of the PMOS transistor and NMOS transistor. Channel regions 26 are formed below the respective gate oxides of the PMOS transistor and NMOS transistor. The semiconductor substrate 20 additionally comprises an ultra-thin buried oxide layer 27 arranged below respective drain diffusions 25, source diffusions 24 and gate channels 26 of the NMOS and PMOS transistors. This ultra-thin buried oxide layer 27 insulates these diffusion regions from the P-substrate 20 and N-well and P-well diffusions and largely eliminates their parasitic capacitances to the substrate and wells leading to lower switching losses and higher switching speeds of the gate circuit. This ultra-thin buried oxide layer 27 also eliminates electrical connections of the respective bodies of the NMOS transistor and PMOS transistor from the negative supply voltage $V_{CC}$ and the positive supply voltage $V_{DD}$ allowing significant adjustments of the respective body voltages to very effectively control the respective threshold voltages of the NMOS and PMOS transistors leading to the above discussed flexible and wide adjustment range of the on-resistance of the NMOS and PMOS transistors. The PMOS transistor comprises a body terminal or connection 22' which is connected to the N-well 21. The body terminal or connection 22' may be connected to a first back bias voltage grid or wire for receipt of the first back bias voltage $V_{BP}$.–. As discussed above, the first back bias voltage $V_{BP}$ is supplied by the bias voltage generator 4. The NMOS transistor comprises a body terminal or connection 10 for receipt of the second back bias voltage $V_{BN}$—for example through a bias voltage grid or wire. As discussed above, the second back bias voltage $V_{BN}$ is also supplied by the bias voltage generator 4.

Figure 5A:
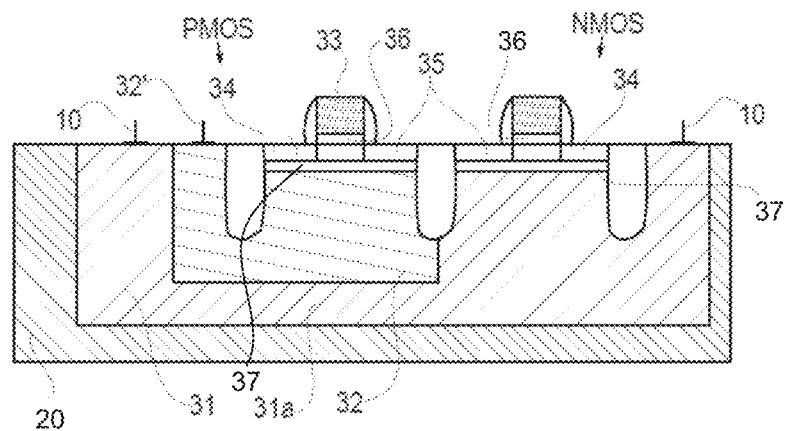
FIG. 5A and FIG. 5B show cut-through and top-view transistor layouts, respectively, of a half-bridge driver portion of the integrated circuit output driver integrated in a so-called flip-well FD SOI process.
Figure 5B:
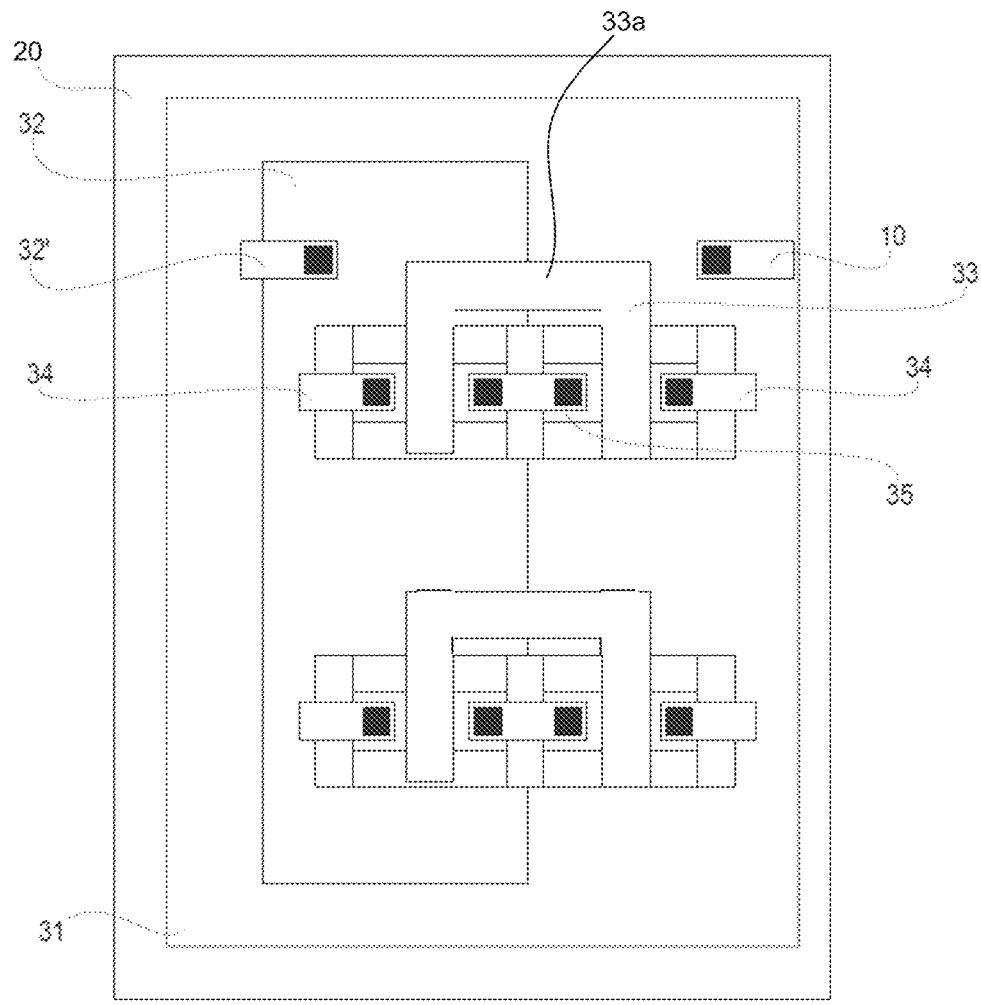

FIG. 5A is a vertical cut-through view of an exemplary transistor layout of the previously discussed PMOS and NMOS transistors 16, 17, 18, 19 of the first half-bridge driver 6 or second half-bridge driver 8 of the H-bridge output driver of the integrated circuit 1 integrated in a so-called flip-well FD SOI process. The half-bridge driver comprises a PMOS transistor arranged in a P-well diffusion 32 within a surrounding N-well diffusion or region 31 and deep N-well diffusion 31a. The N-well diffusion 31 and deep N-well diffusion 31a are formed in a P-polarity semiconductor substrate 20. The half-bridge driver furthermore comprises an NMOS transistor arranged in the N-well diffusion 31. The respective gate terminals 33a of the PMOS and NMOS transistors of the half-bridge driver may in some embodiments be electrically connected via a polysilicon gate layer 23 to form a common input terminal output stage as illustrated on FIG. 5B. In other embodiments, the gate terminals 23 of the PMOS and NMOS transistors are unconnected such that each of the MOS transistors can be separately controlled by an appropriate phase signal as illustrated on FIG. 1. The drain terminal 35 of the PMOS transistor and the drain terminal 35 of the NMOS transistor are electrically connected via a metal layer to form an output terminal of the inverter circuit as best illustrated on FIG. 5B. Respective gate oxides 36 are arranged below the gate terminals 33 of the PMOS transistor and NMOS transistor. Channel regions are formed below the respective gate oxides of the PMOS transistor and NMOS transistor. The semiconductor substrate 20 comprises an ultra-thin buried oxide layer 37 arranged below respective drain diffusions 35, respective source diffusions 34 and respective gate channels of the NMOS and PMOS transistors. This ultra-thin buried oxide layer 37 insulates the source and drain diffusion regions from the P-well diffusion 32 and the N-well diffusion 31 and largely eliminates their parasitic capacitances to the respective wells and/or P-substrate 20 leading to lower switching losses and higher switching speeds of the half-bridge driver. This ultra-thin buried oxide layer 37 also eliminates the electrical connections between respective bodies of the NMOS transistor(s) and PMOS transistor(s) of the half-bridge driver from the negative supply voltage $V_{CC}$ and the positive supply voltage $V_{DD}$. This feature allows significant adjustments of the respective body voltages to very effectively control the respective threshold voltages of the NMOS and PMOS transistors of the half-bridge driver 6 leading to the above discussed advantageous reduction of output resistance of the driver 6. The PMOS transistor comprises a body terminal or connection 32' which is connected to the P-well diffusion 32. The body terminal or connection 32' allows receipt of the adjustable first back bias voltage $V_{BP}$—for example through a suitable back bias grid or wire of the integrated circuit. As discussed above, the first back bias voltage $V_{BP}$ is supplied by the bias voltage generator 4. The NMOS transistor comprises a one or several body terminal (s) or connection(s) 10 which is/are connected to the N-well diffusion 31 and deep N-well diffusion 31a. The body terminal or connection 10 of the NMOS transistor is connected to the second back bias voltage $V_{BN}$—for example through a wire grid. As discussed above, the second back bias voltage $V_{BN}$ is also supplied by the programmable or adjustable bias voltage generator 4. The skilled person will understand that the second back bias voltage $V_{BN}$ preferably is less than 300 mV, for example 100 mV or 200 mV, lower than the negative DC supply voltage (which is connected to the source terminal 34 of the NMOS transistor). This voltage difference will typically prevent any massive flow of leakage current from the body terminal 10 into the underlying P-substrate due to the creation of a forward biased diode junction.

The invention claimed is:

1. A hearing instrument comprising:
   an audio transducer and an output driver for driving the audio transducer, wherein the output driver of the hearing instrument comprises:
   a positive supply voltage rail and a negative supply voltage rail;
   a first half-bridge driver comprising a first PMOS transistor and a first NMOS transistor connected in series between the positive and the negative supply voltage rails to form a first driver output;
   a bias voltage generator configured to provide a first back bias voltage and a second back bias voltage;
   a first body terminal connected to a body of the first PMOS transistor for receipt of the first back bias voltage; and
   a second body terminal connected to a body of the first NMOS transistor for receipt of the second back bias voltage;
   wherein the bias voltage generator is configured to adjust the first back bias voltage, the second back bias voltage, or both, to control on-resistance of the first PMOS transistor and/or on-resistance of the first NMOS transistor.

2. The hearing instrument according to claim 1, wherein the bias voltage generator is configured to adjust the first back bias voltage to at least one of a plurality of fixed bias voltage levels.

3. The hearing instrument according to claim 2, wherein the plurality of fixed bias voltage levels comprises at least:
a first voltage level equal to a DC voltage of the positive supply voltage rail, and
a second voltage level smaller than the DC voltage of the positive supply voltage rail.

4. The hearing instrument according to claim 2, wherein the plurality of fixed bias voltage levels comprises at least:
a first voltage level equal to a DC voltage of the negative supply voltage rail, and
a second voltage level at a fixed voltage exceeding the DC voltage of the negative supply voltage rail.

5. The hearing instrument according to claim 2, wherein a voltage difference between a maximum level and a minimum level of the plurality of fixed bias voltage levels is larger than 100 mV.

6. The hearing instrument according to claim 1, wherein the bias voltage generator is configured to adjust the first back bias voltage, the second back bias voltage, or both, continuously between an upper bias voltage limit and a lower bias voltage limit.

7. The hearing instrument according to claim 1, further comprising:
a second half-bridge driver having a second PMOS transistor and a second NMOS transistor connected in series between the positive and the negative supply voltage rails to form a second driver output at interconnected drain terminals of the second PMOS transistor and the second NMOS transistor;
a third body terminal connected to a body of the second PMOS transistor for receipt of the first back bias voltage; and
a fourth body terminal connected to a body of the second NMOS transistor for receipt of the second back bias voltage.

8. The hearing instrument according to claim 1, wherein the first half-bridge driver comprises a second PMOS transistor and a second NMOS transistor connected in series between the positive and negative supply voltage rails, wherein the second PMOS transistor comprises a third body terminal for receipt of the first back bias voltage, and the second NMOS transistor comprises a fourth body terminal for receipt of second back bias voltage;
wherein the output driver has a first state in which the second PMOS transistor and second NMOS transistor are connected in parallel with the first PMOS transistor and the first NMOS transistor; and
wherein the output driver has a second state in which the second PMOS transistor and second NMOS transistor are disconnected from the first PMOS transistor and first NMOS transistor.

9. The hearing instrument according to claim 8, wherein when the output driver is in the second state, the third body terminal of the second PMOS transistor is connected to a first DC reference voltage, and the fourth body terminal of the second NMOS transistor is connected to a second DC reference voltage;
wherein the first DC reference voltage exceeds a DC voltage of the positive supply voltage rail, and the second DC reference voltage is lower than a DC voltage of the negative supply voltage rail.

10. The hearing instrument according to claim 1, wherein the first driver output is formed at interconnected drain terminals of the first PMOS transistor and the first NMOS transistor.

11. A hearing instrument comprising:
an audio transducer and an output driver for driving the audio transducer, comprising wherein the output driver of the hearing instrument comprises:
a positive supply voltage rail and a negative supply voltage rail;
a first half-bridge driver comprising a first PMOS transistor and a first NMOS transistor connected in series between the positive and the negative supply voltage rails to form a first driver output;
a bias voltage generator configured to provide a first back bias voltage and a second back bias voltage, wherein the bias voltage generator is configured to adjust the first back bias voltage, the second back bias voltage, or both, to control on-resistance of the first PMOS transistor and/or on-resistance of the first NMOS transistor;
a first body terminal connected to a body of the first PMOS transistor for receipt of the first back bias voltage;
a second body terminal connected to a body of the first NMOS transistor for receipt of the second back bias voltage; and
a controller configured to:
determine or measure a load current or a load power of a load; and
control the bias voltage generator to adaptively adjust the first back bias voltage, the second back bias voltage, or both, based on the determined or measured load current or load power.

12. The hearing instrument according to claim 11, wherein the bias voltage generator is configured to:
decrease the first back bias voltage of the first PMOS transistor for increasing the load current or the load power; and/or
increase the second back bias voltage of the first NMOS transistor for increasing the load current or the load power.

13. A hearing instrument comprising:
an audio transducer and an output driver for driving the audio transducer, wherein the output driver of the hearing instrument comprises:
a positive supply voltage rail and a negative supply voltage rail;
a first half-bridge driver comprising a first PMOS transistor and a first NMOS transistor connected in series between the positive and the negative supply voltage rails to form a first driver output;
a bias voltage generator configured to provide a first back bias voltage and a second back bias voltage, wherein the bias voltage generator is configured to adjust the first back bias voltage, the second back bias voltage, or both, to control on-resistance of the first PMOS transistor and/or on-resistance of the first NMOS transistor;
a first body terminal connected to a body of the first PMOS transistor for receipt of the first back bias voltage; and
a second body terminal connected to a body of the first NMOS transistor for receipt of the second back bias voltage;

wherein the output driver is integrated on a fully depleted Silicon on Insulator (FD SOI) semiconductor substrate or a partially depleted Silicon on Insulator (PD SOI) semiconductor substrate.

14. The hearing instrument according to claim 13, wherein the fully or partially depleted Silicon on Insulator substrate comprises a standard well structure, the standard well structure comprising:
at least one N-well comprising the first PMOS transistor of the first half-bridge driver, the at least one N-well being connected to the first body terminal for receipt of the first back bias voltage; and
a least one P-well comprising the first NMOS transistor of the first half-bridge driver, the at least one P-well being connected to the second body terminal for receipt of the second back bias voltage.

15. The hearing instrument according to claim 13, wherein the fully or partially depleted Silicon on Insulator substrate comprises a flip-well structure, the flip-well structure comprising:
at least one N-well comprising the first NMOS transistor of the first half-bridge driver, the at least one N-well being connected to the second body terminal for receipt of the second back bias voltage; and
at least one P-well comprising the first PMOS transistor of the first half-bridge driver, the at least one P-well being connected to the first body terminal for receipt of the first back bias voltage; and
a n-well diffusion arranged below the at least one P-well.

16. A hearing instrument comprising:
a processing circuit, the processing circuit having a first audio input channel for receipt of a first audio signal, a signal processor for receipt and processing of the first audio signal for generating a compensated microphone signal according to a hearing loss of a user; and
an output amplifier for receipt of the compensated microphone signal and generation of an amplified or buffered output signal for application to a receiver or loudspeaker of the hearing instrument;
wherein the output amplifier comprises an output driver comprising:
a positive supply voltage rail and a negative supply voltage rail;
a first half-bridge driver comprising a first PMOS transistor and a first NMOS transistor connected in series between the positive and the negative supply voltage rails to form a first driver output;
a bias voltage generator configured to provide a first back bias voltage and a second back bias voltage, wherein the bias voltage generator is configured to adjust the first back bias voltage, the second back bias voltage, or both, to control on-resistance of the first PMOS transistor and/or on-resistance of the first NMOS transistor;
a first body terminal connected to a body of the first PMOS transistor for receipt of the first back bias voltage; and
a second body terminal connected to a body of the first NMOS transistor for receipt of the second back bias voltage.

17. A method performed by the hearing instrument of claim 16, comprising:
supplying a positive DC supply voltage to the first PMOS transistor of the first half-bridge driver;
supplying a negative DC supply voltage to the first NMOS transistor of the half-bridge driver;
generating the first back bias voltage and applying the first back bias voltage to the body of the first PMOS transistor;
generating the second back bias voltage and applying the second back bias voltage to the body of the first NMOS transistor; and
adjusting the first back bias voltage and/or the second back bias voltage for controlling an on-resistance of the first PMOS transistor and/or the first NMOS transistor.

18. A method performed by the hearing instrument of claim 16, comprising:
supplying a positive DC supply voltage to the first PMOS transistor of the half-bridge driver;
supplying a negative DC supply voltage to the first NMOS transistor of the half-bridge driver;
generating the first back bias voltage and applying the first back bias voltage to the first PMOS transistor;
generating the second back bias voltage and applying the second back bias voltage to the first NMOS transistor;
determining or measuring a load current or load power delivered to a load connected to the half-bridge driver; and
adjusting the first back bias voltage and/or the second back bias voltage based on the determined or measured load current or load power.

19. The hearing instrument according to claim 16, wherein the bias voltage generator is configured to adjust the first back bias voltage to at least one of a plurality of fixed bias voltage levels.

20. The hearing instrument according to claim 19, wherein a voltage difference between a maximum level and a minimum level of the plurality of fixed bias voltage levels is larger than 100 mV.

21. The hearing instrument according to claim 16, wherein the bias voltage generator is configured to adjust the first back bias voltage, the second back bias voltage, or both, continuously between an upper bias voltage limit and a lower bias voltage limit.

22. The hearing instrument according to claim 16, further comprising a controller configured to:
determine or measure a load current or a load power of a load; and
control the bias voltage generator to adaptively adjust the first back bias voltage, the second back bias voltage, or both, based on the determined or measured load current or load power.

23. The hearing instrument according to claim 22, wherein the bias voltage generator is configured to:
decrease the first back bias voltage of the first PMOS transistor for increasing the load current or the load power; and/or
increase the second back bias voltage of the first NMOS transistor for increasing the load current or the load power.

24. The hearing instrument according to claim 16, further comprising:
a second half-bridge driver having a second PMOS transistor and a second NMOS transistor connected in series between the positive and the negative supply voltage rails to form a second driver output at interconnected drain terminals of the second PMOS transistor and the second NMOS transistor;
a third body terminal connected to a body of the second PMOS transistor for receipt of the first back bias voltage; and a fourth body terminal connected to a body of the second NMOS transistor for receipt of the second back bias voltage.

25. The hearing instrument according to claim 16, wherein the first half-bridge driver comprises a second PMOS transistor and a second NMOS transistor connected in series between the positive and negative supply voltage rails, wherein the second PMOS transistor comprises a third body terminal for receipt of the first back bias voltage, and the second NMOS transistor comprises a fourth body terminal for receipt of second back bias voltage;
   wherein the output driver has a first state in which the second PMOS transistor and second NMOS transistor are connected in parallel with the first PMOS transistor and the first NMOS transistor; and
   wherein the output driver has a second state in which the second PMOS transistor and second NMOS transistor are disconnected from the first PMOS transistor and first NMOS transistor.

26. The hearing instrument according to claim 25, wherein when the output driver is in the second state, the third body terminal of the second PMOS transistor is connected to a first DC reference voltage, and the fourth body terminal of the second NMOS transistor is connected to a second DC reference voltage;
   wherein the first DC reference voltage exceeds a DC voltage of the positive supply voltage rail, and the second DC reference voltage is lower than a DC voltage of the negative supply voltage rail.

27. The hearing instrument according to claim 16, wherein the output driver is integrated on a fully depleted Silicon on Insulator (FD SOI) semiconductor substrate or a partially depleted Silicon on Insulator (PD SOI) semiconductor substrate.

28. The hearing instrument according to claim 27, wherein the fully or partially depleted Silicon on Insulator substrate comprises a standard well structure, the standard well structure comprising:
   at least one N-well comprising the first PMOS transistor of the first half-bridge driver, the at least one N-well being connected to the first body terminal for receipt of the first back bias voltage; and
   a least one P-well comprising the first NMOS transistor of the first half-bridge driver, the at least one P-well being connected to the second body terminal for receipt of the second back bias voltage.

29. The hearing instrument according to claim 27, wherein the fully or partially depleted Silicon on Insulator substrate comprises a flip-well structure, the flip-well structure comprising:
   at least one N-well comprising the first NMOS transistor of the first half-bridge driver, the at least one N-well being connected to the second body terminal for receipt of the second back bias voltage; and
   at least one P-well comprising the first PMOS transistor of the first half-bridge driver, the at least one P-well being connected to the first body terminal for receipt of the first back bias voltage; and
   a n-well diffusion arranged below the at least one P-well.

30. The hearing instrument according to claim 16, wherein the first driver output is formed at interconnected drain terminals of the first PMOS transistor and the first NMOS transistor.

* * * * *